United States Patent [19]
Tanaka

[11] Patent Number: 5,714,718
[45] Date of Patent: Feb. 3, 1998

[54] LAMINATE WIRING BOARD

[75] Inventor: Shinji Tanaka, Tokyo, Japan

[73] Assignee: NEC Corporation, Tokyo, Japan

[21] Appl. No.: 660,890

[22] Filed: Jun. 10, 1996

[30]  Foreign Application Priority Data

Jun. 8, 1995 [JP] Japan ................. 7-141969

[51] Int. Cl.$^6$ ................................. H05K 1/03
[52] U.S. Cl. ............... 174/255; 361/792; 361/794
[58] Field of Search ....................... 174/255, 261;
361/792, 795, 794, 780; 333/238, 246

[56] References Cited

U.S. PATENT DOCUMENTS 4,130,723  12/1978  Wakeling ............................ 174/36
5,272,600  12/1993  Carey ................................. 361/792
5,508,938  4/1996  Wheeler ............................. 364/488

FOREIGN PATENT DOCUMENTS 60-233881  11/1985  Japan.

Primary Examiner—Kristine L. Kincaid
Assistant Examiner—Kristina Soderquist
Attorney, Agent, or Firm—Sughrue, Mion, Zinn, Macpeak & Seas, PLLC

[57]  ABSTRACT

In a data processing apparatus, communication apparatus or similar electronic apparatus, a laminate wiring board has a signal layer having a ground area and interposed between a signal layer and a power supply layer. Therefore, there is no need to provide a ground layer between the signal layer and the power supply layer. The wiring board can therefore be implemented with a small number of layers and is free from faults ascribable to extra layers.

9 Claims, 2 Drawing Sheets 5,714,718

LAMINATE WIRING BOARD

BACKGROUND OF THE INVENTION

The present invention relates to a laminate wiring board for use in a data processing apparatus, communication apparatus or similar electronic apparatus.

Generally, in the design of a laminate wiring board allowing interface signals of different amplitudes to exist together, a layer that is allowed to face a given interface signal is only a ground layer or a power supply layer whose voltage is close to the amplitude of the interface signal. Japanese Patent Laid-Open Publication No. 60-233881, for example, teaches a laminate wiring board having a power supply layer or a ground layer intervening between a given signal layer and another signal layer. Specifically, if a power supply layer whose voltage is different from the amplitude of an interface signal faces the signal, then, noise and crosstalk occur due to coupling and result in malfunction. This is why the above power supply layer is inhibited from facing the interface signal. As a result, the conventional laminate wiring board needs at least the same number of signal layers as the number of kinds of signals. The increase in the number of signal layers increases the amount of metal required and aggravates faults in, e.g., the connection between the layers.

SUMMARY OF THE INVENTION

It is therefore an object of the present invention to provide a laminate wiring board needing a minimum number of layers.

It is another object of the present invention to provide a laminate wiring board needing a minimum amount of metal.

It is yet another object of the present invention to provide a reliable laminated wiring board.

It is a further object of the present invention to provide a laminate wiring board capable of simplifying production steps and thereby enhancing productivity.

In accordance with the present invention, a laminate wiring board has a first signal wiring layer having a first signal wiring area, a power supply layer, and a second signal wiring layer intervening between the power supply layer and the first signal wiring layer. The second signal wiring layer has a ground layer area sized at least the same as the first signal wiring area at a position corresponding to the first signal wiring area, and has a second signal wiring area at the other position.

Also, in accordance with the present invention, a laminate wiring board has a ground potential layer, a first kind of power supply layer, and a signal layer made up of two layers and facing at least one of the ground potential layer and first kind of power supply layer. One of the two layers of the signal layer is an exclusive layer for a signal while the other layer partly constitutes the ground potential layer or a second kind of power source layer.

Further, in accordance with the present invention, a laminate wiring board has a ground potential layer, a power supply layer, and a signal layer made up of a first layer facing the ground potential layer and a second layer facing the power supply layer and partly constituting a ground potential layer area.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENT

Figure 1:
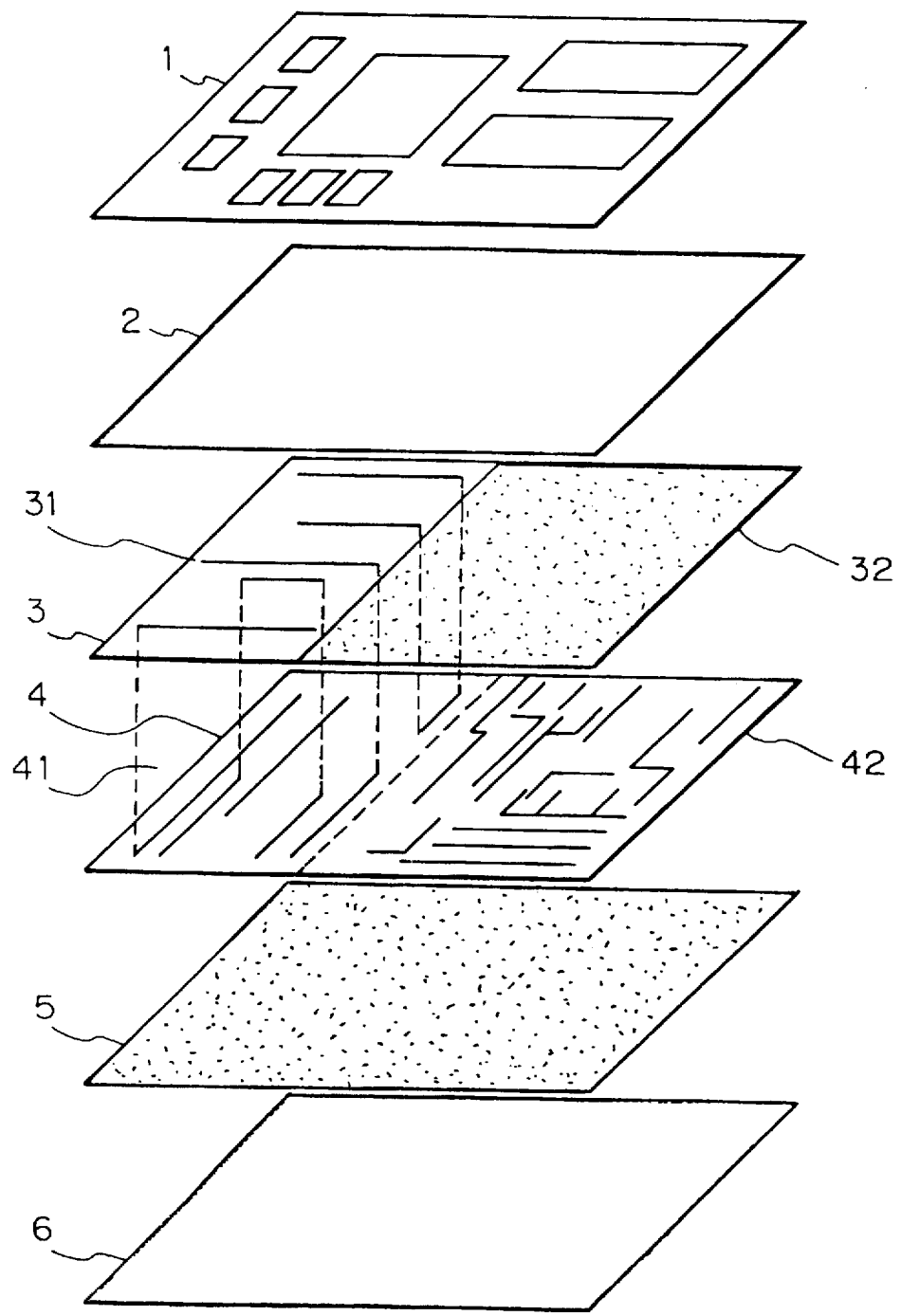
FIG. 1 is an exploded perspective view of a laminate wiring board embody g the present invention.
Figure 2:
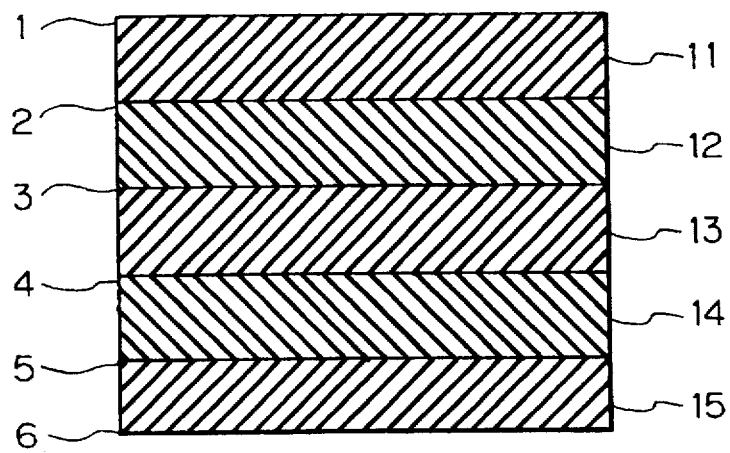
FIG. 2 is a section showing the embodiment.

Referring to FIGS. 1 and 2 of the drawings, a laminate wiring board embodying the present invention is shown and includes a cover layer 1. A +3.3 V power supply layer 2 applies a +3.3 V power supply to a TTL (Transistor-Transistor Logic) signal wiring; +3.3 V is the amplitude of a TLL signal. An insulating layer 11 intervenes between the cover layer 1 and the 3.3 V power supply layer 2. A first signal S1 layer 3 is made up of a TTL signal wiring area 31 and a ground layer area 32. An insulating layer 12 intervenes between the first signal S1 layer 3 and the +3.3 V power supply layer 2. A second signal S2 layer 4 is made up of a TTL signal wiring area 41 and a GTL (Gunning Transceiver Logic) signal wiring area 42 corresponding to the TTL signal wiring area and ground layer area 32, respectively. An insulating layer 13 intervenes between the second signal S2 layer 4 and the first signal S1 layer 3. A ground layer 5 has a structure similar to the structure of the ground layer area 32 of the first signal S1 layer 3. An insulating area 14 intervenes between the ground layer 5 and the second signal S2 layer 4. A +1.2 V power supply layer 6 applies a +1.2 V power supply corresponding to the amplitude of a GTL signal. An insulating layer 15 intervenes between the +1.2 V power supply layer 6 and the ground layer 5.

The insulating layers 11, 12, 13 and 14 may each be formed of at least one of glass epoxy, polyimide, and glass ceramic. For the ground layer 5 and ground layer area 32, use is made of copper foil.

A reference will be made to FIGS. 3 and 4 for describing characteristic features of the illustrative embodiment.

Figure 3:
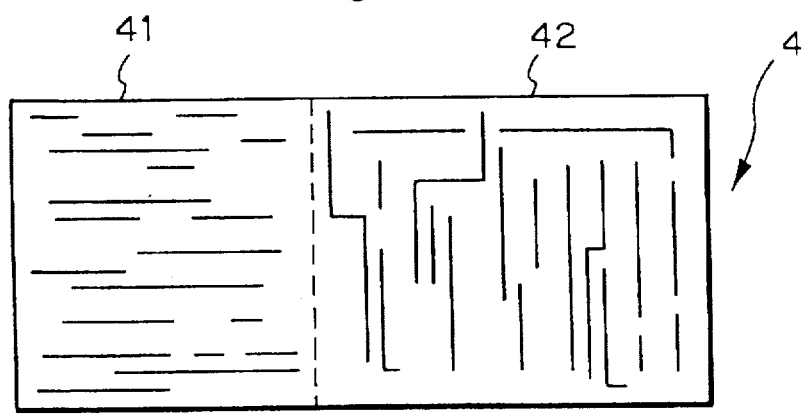
FIG. 3 is a plan view showing a signal S2 layer included in the embodiment.

As shown in FIG. 3, the second signal S2 layer 4 of the wiring board is divided into the TTL wiring area 41 having only horizontal wirings and the GTL signal wiring area 42.

Figure 4:
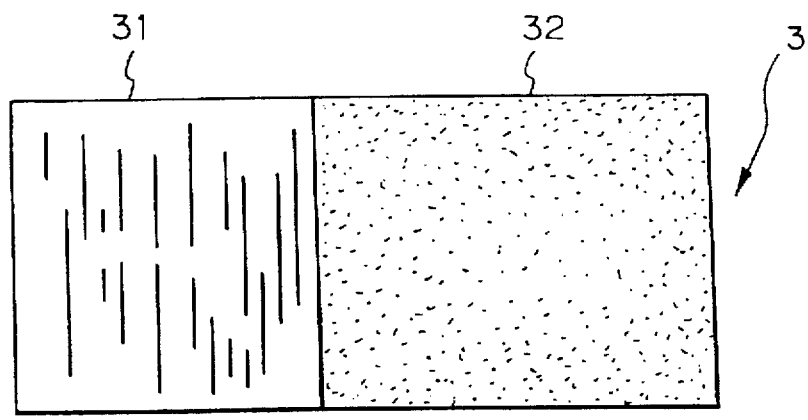
FIG. 4 is a plan view showing a signal S1 layer also included in the embodiment.

As shown in FIG. 4, the ground layer area 32 of the first signal S1 layer 3 is implemented by a piece of copper foil having an area equal to or greater than the area of the GTL signal wiring area 42 of the second signal S2 layer 4 shown in FIG. 3. The rest of the first signal S1 layer 3, i.e., the TTL signal wiring area 31 has vertical wirings different in direction from the TTL signal wirings of the second signal S2 layer 4. The wirings of the wiring area 31 are electrically connected to the wirings of the wiring area 41 so as to form a wiring network. For a GTL signal, a wiring network is constituted only by the GTL signal wiring area 42 of the second signal S2 layer 4.

The illustrative embodiment is characterized in that the signal wiring areas 41 and 42 different in the signal amplitude of the signal layer or the power supply voltage from each other are provided on a single layer 4 side by side. Also the embodiment is characterized in that while the signal S 1 and signal S2 layers 3 and 4 are provided in a pair and respectively face the ground layer 5 and +3.3 V power supply layer 2, the signal S1 layer 3 is divided into the ground layer area 32 and signal wiring area 31.

With the above configuration, it is not necessary to provide the ground layer 5 between the signal layer and the power supply layer 2. This successfully prevents the number of layers from increasing.

In summary, it will be seen that the present invention provides a laminate wiring board having the following unprecedented advantages.

(1) Because a signal layer having a ground area is interposed between a signal layer and a power supply layer, a ground layer does not have to be provided between the signal layer and the power supply layer. The wiring board can therefore be implemented with a small number of layers and is free from faults ascribable to extra layers.

(2) The wiring board needs a minimum amount of metal.

(3) The wiring board reduces the number of production steps and thereby enhances productivity.

Various modifications will become possible for those skilled in the art after receiving the teachings of the present disclosure without departing from the scope thereof.

What is claimed is:

1. A laminate wiring board comprising:

a first signal wiring layer (4) having a first signal wiring area (42);

a power supply layer (2); and a second signal wiring layer (3) intervening between said power supply layer and said first signal wiring layer, and having a ground layer area (32) sized at least the same as said first signal wiring area at a position directly opposing said first signal wiring area, and having a second signal wiring area (31) at another position, wherein said first signal wiring layer has in an area thereof other than said first signal wiring area a third signal wiring area (41) at a position directly opposing said second signal wiring area for a signal different in at least one of a signal amplitude and a supply voltage.

2. A laminate wiring board as claimed in claim 1, wherein a signal in said third signal wiring area of said first signal wiring layer and a signal in said second signal wiring area of said second signal wiring layer are electrically connected to each other.

3. A laminate wiring board as claimed in claim 1, further comprising insulating layers (12), (13) respectively intervening between said power supply layer and said second signal wiring layer and between said second signal wiring layer and said first signal wiring layer.

4. A laminate wiring board comprising:

a ground potential layer (5);

a first kind of power supply layer (6); and a signal layer made up of two layers (3), (4) and facing at least one of said ground potential layer and said first kind of power supply layer, wherein one of said two layers of said signal layer is an exclusive layer for a signal while of said two layers partly constitutes said ground potential layer or a second kind of power source layer.

5. A laminate wiring board as claimed in claim 4, further comprising insulating layers (13), (14), (15) respectively intervening between said two layers of said signal layer, between said signal layer and said ground potential layer, and between said ground potential layer and said first kind of power supply layer.

6. A laminate wiring board as claimed in claim 5, wherein said insulating layers are each formed of at least one of glass epoxy, polyimide, and ceramic.

7. A laminate wiring board comprising:

a ground potential layer (5);

a power supply layer (2); and a signal layer made up of a first layer (4) facing said ground potential layer and a second layer (3) facing said power supply layer, said second layer comprising a ground potential layer area and a signal wiring area, said signal wiring area directly opposing another signal wiring area on said first layer.

8. A laminate wiring board as claimed in claim 7, further comprising insulating layers (13), (14), (12) respectively intervening between said first layer and said second layer of said signal layer, between said signal layer and said ground potential layer, and between said signal layer and said power supply layer.

9. A laminate wiring board as claimed in claim 8, wherein said insulating layers are each formed of at least one of glass epoxy, polyimide, and glass ceramic.

\* \* \* \* \*